United States Patent
Slaughter et al.

(10) Patent No.: US 6,831,312 B2
(45) Date of Patent: Dec. 14, 2004

(54) AMORPHOUS ALLOYS FOR MAGNETIC DEVICES

(75) Inventors: Jon M. Slaughter, Tempe, AZ (US); Renu W. Dave, Chandler, AZ (US); Srinivas V. Pietambaram, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/232,164

(22) Filed: Aug. 30, 2002

(65) Prior Publication Data

US 2004/0041183 A1 Mar. 4, 2004

(51) Int. Cl.$^7$ .............................................. H01L 31/119
(52) U.S. Cl. ......................... 257/295; 257/295; 257/489
(58) Field of Search ................................. 257/295, 421; 324/252; 360/324.12, 324.11, 324.2; 365/158, 324.2; 428/336

(56) References Cited

U.S. PATENT DOCUMENTS

| | | | |
|---|---|---|---|
| 5,285,339 A | | 2/1994 | Chen et al. |
| 5,673,162 A | | 9/1997 | Saito |
| 5,768,181 A | | 6/1998 | Zhu et al. |
| 5,861,328 A | | 1/1999 | Tehrani et al. |
| 5,940,319 A | | 8/1999 | Durlam et al. |
| 5,955,211 A | | 9/1999 | Maeda et al. |
| 5,966,012 A | * | 10/1999 | Parkin ......................... 324/252 |
| 6,054,226 A | * | 4/2000 | Takeda et al. ............... 428/682 |
| 6,198,610 B1 | * | 3/2001 | Kawawake et al. .... 360/324.12 |
| 6,205,052 B1 | | 3/2001 | Slaughter et al. |
| 6,211,090 B1 | | 4/2001 | Durlam et al. |
| 6,249,406 B1 | | 6/2001 | Gill et al. |
| 6,292,389 B1 | | 9/2001 | Chen et al. |
| 6,317,299 B1 | * | 11/2001 | Pinarbasi ................ 360/324.11 |
| 6,338,899 B1 | * | 1/2002 | Fukuzawa et al. ........... 428/332 |
| 6,430,084 B1 | | 8/2002 | Rizzo et al. |
| 6,449,133 B1 | * | 9/2002 | Makino et al. ......... 360/324.11 |
| 6,487,110 B2 | * | 11/2002 | Nishimura et al. .......... 365/158 |
| 6,556,473 B2 | * | 4/2003 | Saito et al. .................. 365/158 |
| 6,567,246 B1 | * | 5/2003 | Sakakima et al. ..... 360/324.11 |
| 2002/0044396 A1 | * | 4/2002 | Amano et al. ............ 360/324.2 |
| 2002/0097540 A1 | * | 7/2002 | Hayashi et al. ......... 360/324.12 |

FOREIGN PATENT DOCUMENTS

| EP | 02288209 | 11/1990 |
|---|---|---|
| EP | 2001068760 | 3/2001 |

OTHER PUBLICATIONS

Jimbo et al., "Giant magnetoresistance effect and electric conduction in amorphous—CoFeB/Cu/Co sandwiches," J. Appl. Phys., 79 (8), Apr. 15, 1996, pp. 6237–6239.

Tsunashima et al., "Induced anisotropy and permeability in amorphous Fe–B and Co–Fe–B films," IEEE, Transactions on Magnetics, vol. Mag–17, No. 6, Nov. 1981, pp. 3073–3075.

* cited by examiner

Primary Examiner—David Nelms
Assistant Examiner—Thinh T Nguyen
(74) Attorney, Agent, or Firm—Ingrassia, Fisher & Lorenz, P.C.

(57) ABSTRACT

An amorphous layer of a cobalt iron-based (CoFe-based) magnetic alloy suitable for use in magnetoelectronic devices is disclosed. In the most preferred embodiments of the present invention, at least one amorphous layer is provided in an MTJ stack to increase the smoothness of the various layers in the MTJ stack while also enhancing the magnetic performance of the resulting device. Additionally, the alloys of the present invention are also useful in cladding applications to provide electrical flux containment for signal lines in magnetoelectronic devices and as a material for fabricating write heads.

15 Claims, 2 Drawing Sheets

| | ALLOY | RECRYSTALLIZATION TEMPERATURE | MAGNETOSTRICTION ($\lambda$) | DISPERSION (REL. $\sigma$) | POLARIZATION (MR%) | $H_K$ |
|---|---|---|---|---|---|---|
| 110 | NiFe | - - - | ZERO | 4.80% | 40-45% | 5 |
| 120 | NiFeCo | - - - | ZERO | 3.76% | 40-50% | 20-22 |
| 130 | CoFeB | 325-350° C | ZERO | 2.74% | 42-50% | 19-24 |
| 140 | CoFeTa | >350° C | >5 x $10^{-6}$ | 6.69% | 40-50% | 38 |
| 150 | CoFeHf | >350° C | >5 x $10^{-6}$ | 5.15% | 40-50% | 46 |
| 160 | CoFeNb | 300° C | >5 x $10^{-6}$ | - - - | 40-50% | 31 |
| 170 | CoFeC | ~175° C | ZERO | - - - | - - - | - - - |
| 180 | CoFeTaC | ~350° C | >1 x $10^{-6}$ | 6.90% | - - - | 36 |

| ALLOY | RECRYSTALLIZATION TEMPERATURE | MAGNETOSTRICTION ($\lambda$) | DISPERSION (REL. $\sigma$) | POLARIZATION (MR%) | $H_K$ |
|---|---|---|---|---|---|
| NiFe | --- | ZERO | 4.80% | 40-45% | 5 |
| NiFeCo | --- | ZERO | 3.76% | 40-50% | 20-22 |
| CoFeB | 325-350° C | ZERO | 2.74% | 42-50% | 19-24 |
| CoFeTa | >350° C | >5 x $10^{-6}$ | 6.69% | 40-50% | 38 |
| CoFeHf | >350° C | >5 x $10^{-6}$ | 5.15% | 40-50% | 46 |
| CoFeNb | 300° C | >5 x $10^{-6}$ | --- | 40-50% | 31 |
| CoFeC | ~175° C | ZERO | --- | --- | --- |
| CoFeTaC | ~350° C | >1 x $10^{-6}$ | 6.90% | --- | 36 |

FIG. 1

AMORPHOUS ALLOYS FOR MAGNETIC DEVICES

FIELD OF THE INVENTION

The present invention generally relates to magnetoelectronics, and more particularly to material composition for magnetoelectronics elements.

BACKGROUND OF THE INVENTION

Magnetoelectronics, spin electronics, and spintronics are synonymous terms for the use of effects predominantly caused by electron spin. Magnetoelectronics is used in numerous information devices, and provides non-volatile, reliable, radiation resistant, and high-density data storage and retrieval. The numerous magnetoelectronics information devices include, but are not limited to, magnetic random access memory (MRAM), magnetic sensors and read heads for disk drives.

Typically, a magnetoelectronic device, such as a magnetic memory element, has a structure that includes multiple ferromagnetic layers separated by at least one non-magnetic layer. In a memory element, information is stored as directions of magnetization vectors in the magnetic layers. Magnetization vectors in one magnetic layer, for instance, are magnetically fixed or pinned, while the magnetization direction of the other magnetic layer is free to switch between the same and opposite directions that are called "parallel" and "antiparallel" states, respectively. In response to parallel and antiparallel states, the magnetic memory element represents two different resistances. The resistance has minimum and maximum values when the magnetization vectors of the two magnetic layers point in substantially the same and opposite directions, respectively. Accordingly, a detection of change in resistance allows a device, such as an MRAM device, to provide information stored in the magnetic memory element. The difference between the minimum and maximum resistance values, divided by the minimum resistance is known as the magnetoresistance ratio (MR).

The physical structure of these magnetic elements typically includes thin layers, some of which are in the range of tens of angstroms thick. The performance of the magnetic element is also relatively sensitive to the surface conditions on which the magnetic layers are deposited. Accordingly, it is generally desirable to make as flat a surface as possible in order to prevent the operational characteristics of a magnetic element from exhibiting undesirable characteristics.

During typical magnetic element fabrication, such as MRAM element fabrication, which includes metal films grown by sputter deposition, evaporation, or epitaxy techniques, the film surfaces are not absolutely flat but instead tend to exhibit some surface or interface roughness. This roughness of the surfaces and/or interfaces of the ferromagnetic layers can be a source of magnetic coupling between the free ferromagnetic layer and the other ferromagnetic layers, such as the fixed layer or pinned layer. This magnetic coupling is commonly known as "topological coupling" or "Néel's orange peel coupling." Such coupling is typically undesirable in magnetic elements because it can create an offset in the response of the free layer to an external magnetic field. Additionally, the roughness may also introduce a certain amount of degradation in the electrical characteristics of the device by scattering conduction electrons or by causing variations in the tunneling current of the tunnel junction.

A magnetic structure is known as bottom pinned when the fixed layer is formed before the spacer layer, and the free layer is formed after the spacer layer. In such a bottom-pinned structure the antiferromagnetic (AF) pinning layer is contained in the bottom magnetic electrode. Conventional bottom-pinned magnetic tunnel junctions (MTJs) and spin valve structures typically use seed and template layers to produce an oriented, crystalline AF layer for strong pinning.

The bottom electrode of a typical bottom-pinned MTJ structure includes stacked layers of tantalum, a nickel iron alloy, iridium manganese, and a cobalt iron alloy (Ta/NiFe/IrMn/CoFe), which is generally followed by an aluminum oxide (AlOx) tunnel barrier, and a top electrode that typically includes a free layer of nickel iron (NiFe), where the tantalum nitride iron (Ta/NiFe) seed/template layers induce growth of a highly oriented iridium manganese (IrMn) layer. This highly oriented IrMn layer provides for strong pinning of the CoFe layer below the AlOx tunnel barrier. However, the IrMn layer, or other similarly oriented polycrystalline AF layer, typically produces a roughness that can cause an increase in the undesirable Néel coupling between the pinned CoFe layer and the top free NiFe layer, as well as other undesirable electrical characteristics.

In practical MTJ elements, the bottom electrode is generally formed upon a base metal layer that provides a relatively low resistance contact to the junction. The base metal layer is typically polycrystalline and produces a roughness that, in turn, propagates into the bottom electrode and can also produce roughness at the spacer layer interfaces, resulting in an increase in undesirable Néel coupling between the pinned CoFe layer and the top free NiFe layer. The roughness, propagated from the base metal layer and the bottom electrode, is additionally undesirable because it can limit the minimum tunnel barrier thickness that can be achieved while retaining high MR and device resistance that scales inversely with the junction area. Accordingly, it is generally desirable to reduce the surface roughness of the various layers, where possible to do so.

This desire to reduce the roughness of the layers and the layer interfaces has led to use of non-crystalline or amorphous materials in various layers of a multi-layer MTJ stack. Since the amorphous materials typically lack the crystal boundaries and sharp features of other materials, the tunnel barrier resulting from the layers with the amorphous materials will typically provide for enhanced device performance. However, in addition to the advantageous properties useful in forming tunnel barriers, many amorphous materials also exhibit certain undesirable characteristics as well. Specifically, most amorphous alloys exhibit at least one undesirable property such as low recrystallization temperature, low MR, high dispersion, high magnetostriction, or unstable anisotropy. Depending on the desired performance characteristics of the specific magnetoresistive elements, some of these characteristics may result in devices with relatively poor performance.

Accordingly, it is desirable to provide materials which not only reduce the surface roughness of the various layers that form the MTJ elements, but that do not also introduce negative performance factors into the resulting magnetoelectronic devices. Furthermore, other desirable features and characteristics of the present invention will become apparent from the subsequent description and the appended claims, taken in conjunction with the accompanying drawings.

BRIEF DESCRIPTION OF THE DRAWINGS

The present invention will hereinafter be described in conjunction with the appended drawing figures, wherein like numerals denote like elements, and:

FIG. 1 is a table comparing the various properties of certain alloys suitable for use in MTJ applications, including one specific alloy deemed most suitable according to a preferred exemplary embodiment of the present invention;

DETAILED DESCRIPTION OF THE DRAWINGS

Figure 2:
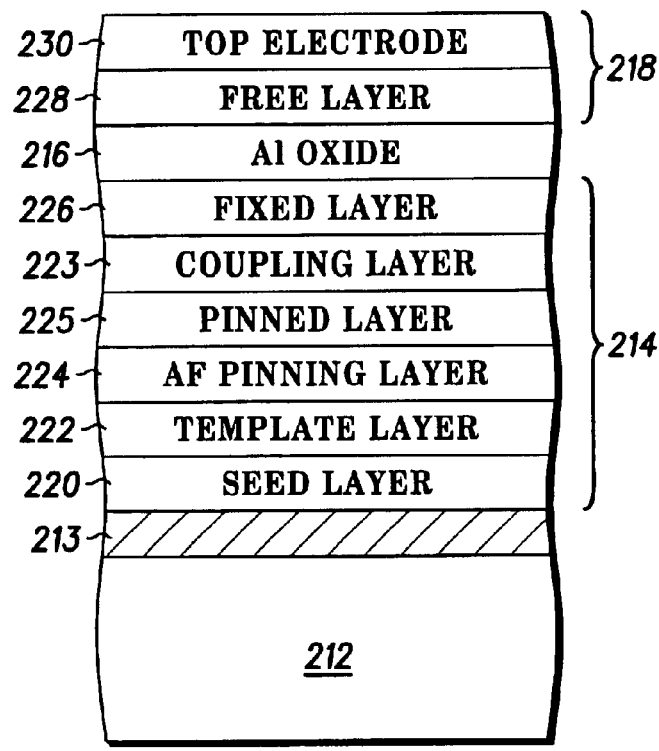
FIG. 2 is a cross-sectional view of a magnetic element with improved magnetic response according to a preferred exemplary embodiment of the present invention.

The following detailed description of the preferred embodiments is merely exemplary in nature and is not intended to limit the invention or the application and uses of the invention. Furthermore, there is no intention to be bound by any theory presented in the preceding background of the invention or the following detailed description of the preferred exemplary embodiments.

The following characteristics are deemed desirable to provide for smoother layers and enhanced magnetic performance in a magnetoelectronic device: relatively low magnetostriction; relatively high recrystallization temperature (i.e., greater than 300° C.); minimal dispersion (spatial variation) of anisotropy; relatively high stability of anisotropy; a substantially nickel-free (Ni-free) composition to increase the thermal endurance of the MTJ stack; near zero magnetorestriction coefficient ($\lambda$), and relatively high polarization for high MR %. While this list of desirable characteristics is not exclusive or exhaustive, it is indicative of some of the more salient characteristics that may be considered when selecting materials for fabricating ferromagnetic layers in magnetoelectronic devices according to the preferred embodiments of the present invention.

Accordingly, disclosed herein are various amorphous alloys exhibiting, in various combinations, the desired characteristics discussed above. For purposes of discussing the various embodiments of the present invention, the term "amorphous" as used herein shall mean material layers in which there is no long-range crystalline order such as that which would give rise to a readily discernable peak using normal x-ray diffraction measurements.

Referring now to FIG. 1, a table 100 illustrates various types of ferromagnetic alloys that might be considered for use in a magnetoelectronic element. These various alloys are listed in rows 110–170. Certain characteristics of interest for each alloy shown in rows 110–170 are shown in columns 105–155. It should be noted that the data shown in table 100 of FIG. 1 is relevant for alloys grown on an AlOx layer, as is typical for magnetic layers grown on AlOx tunnel barriers found in various tunnel junctions commonly used for fabricating magnetoelectronic devices.

In order to provide a free layer with good switching properties, the free layer alloy most preferably has good soft magnetic properties including: square easy-axis magnetization loops; closed hard-axis loops with well defined kink field ($H_k$) with relatively low or negligible remnant magnetization; relatively low coercivity ($H_c$) in both easy and hard directions; and a low magnetostriction coefficient ($\lambda$) such as $\lambda<10^{-6}$. In addition, for some device designs, it is desirable to have a large $H_k$, compared to permalloy ($Ni_{80}Fe_{20}$), for example. In MRAM cells, the large $H_k$ increases the material's contribution to the switching field of a patterned bit. This enables the use of bits with a lower aspect ratio, for example length/width<2, resulting in a smaller device. When used to significantly control the switching field, a relatively high $H_k$ alloy would most preferably have a low dispersion (spatial variation) of $H_k$ to keep the bit-to-bit variations in switching field relatively small. For use in either the free or fixed layer of an MTJ device, a relatively high polarization alloy is desired to provide high MR. Accordingly, an alloy that produces MR greater than approximately 30% is preferred and an alloy that produces MR greater than approximately 40% is most desirable. Finally, for stability of the alloy during processing and subsequent use in various device applications, the recrystallization temperature of the amorphous alloy should preferably be at least approximately 200° C. and most preferably at least approximately 300° C. or greater.

By using these various performance criteria as the basis for formulation, the various alloys shown in table 100 can be compared and evaluated for suitability. As shown in FIG. 1, the cobalt iron boron (CoFeB) alloy shown in row 130 is especially well suited for this use. The Co to Fe ratio of the alloy affects both the magnetostriction and the polarization of the layer. For applications of the alloy in an MTJ free layer, Fe is chosen to give zero or near-zero magnetostriction. The amount of boron (B) included in the alloy controls the recrystallization and polarization of the resultant MTJ device. More boron will result in a relatively higher recrystallization temperature but relatively lower polarization. Accordingly, the specific composition of the alloy may be optimized for different performance criteria based on the specific application. The values shown in table 100 of FIG. 1 are experimental measurements with ranges representing alloys that include enough Fe to provide the desired MR. In addition to the CoFeB alloy shown in table 100 of FIG. 1, other novel CoFe alloys may be used to create MTJ stacks and the like. For purposes of discussion, these various alloys may be represented as CoFeX, with X representing some other suitable element such as tantalum (Ta) and hafnium (Hf).

Referring now to FIG. 2, a magnetic element 200 suitable for use with a preferred exemplary embodiment of the present invention is shown. The structure of magnetic element 200 includes a substrate 212, a first electrode multilayer stack 214, a spacer layer 216 including oxidized aluminum, and a second electrode multilayer stack 218. It should be understood that the specific composition of spacer layer 216 depends upon the type of magnetic element being fabricated. More particularly, in an MTJ structure, spacer layer 216 is preferably formed of a dielectric material and is most preferably formed of aluminum oxide (AlOx), and in a spin valve structure, spacer layer 216 is formed of a conductive material. First electrode multilayer stack 214 and second electrode multilayer stack 218 include ferromagnetic layers. First electrode layers 214 are formed on a base metal layer 213, which is formed on substrate 212. Base metal layer 213 is disclosed as being composed of a single metal material or layer or, alternatively, base metal layer 213 may be a multi-layer stack of more than one metal material or layer. In either case, base metal layer 213 provides electrical contact to first electrode layers 214.

First electrode layers 214 include a first seed layer 220, deposited on base metal layer 213, a template layer 222, a layer of antiferromagnetic pinning layer 224, a pinned ferromagnetic layer 225 formed on and exchange coupled with the underlying antiferromagnetic pinning layer 224, and a fixed layer 226 formed on a metallic coupling layer 223. Metallic coupling layer 223 is formed on pinned ferromagnetic layer 225. Typically, seed layer 220 is formed of tantalum nitride (TaNx) having template layer 222 formed thereon. Template layer 222 in this particular embodiment is formed of ruthenium (Ru).

Ferromagnetic layers 225 and 226 are separated by a metallic coupling layer 223. Metallic coupling layer 223 is most preferably comprised of ruthenium and, combined with ferromagnetic layers 225 and 226, create a synthetic antiferromagnet (SAF) free layer. The antiferromagnetic coupling provided through metallic coupling layer 223 makes magnetic element 200 more stable in applied magnetic fields. Additionally, by varying the thickness of ferromagnetic layers 225 and 226, magnetostatic coupling can be offset and the hysteresis loop can be centered.

Ferromagnetic layers 225 and 226 are described as pinned and fixed in that their magnetic moment is prevented from rotation in the presence of an applied magnetic field. In the most preferred embodiments of the present invention, ferromagnetic layer 225 and/or ferromagnetic layer 226 are an alloy of cobalt (Co), iron (Fe) and boron (B) comprising, by approximate atomic %, Co (71.2%), Fe (8.8%) and B (20%). This composition is a CoFe alloy with B added to it and can be represented as $(Co_{89}Fe_{11})_{80}B_{20}$. For ferromagnetic layers 225 and 226, the percentage of iron can be in the range of approximately 10.5% and 25% and the percentage of boron can be in the range of approximately 15% and 25%.

It should be noted that in this specific embodiment, MR increases relatively rapidly with the iron (Fe) concentration in this region. Additionally, there is at least one other consideration to be made when selecting the amount of boron, or other suitable material such as hafnium (Hf) or tantalum (Ta), to include with the CoFe alloy. Specifically, thermal stability tends to improve when the amount of boron is increased, but the associated signal (MR) tends to decrease. Accordingly, when thermal stability is desired, the concentration of boron can be increased and when higher MR is desired, the concentration of boron can be decreased. The amount of boron can be in the range of approximately 10%–25% and the most preferred embodiments of the present invention contemplate boron in the range of approximately 15%–20%.

Second electrode stack 218 includes a free ferromagnetic layer 228 and a protective contact layer 230. The magnetic moment of the free ferromagnetic layer 228 is not fixed, or pinned, by exchange coupling, and is free to rotate in the presence of an applied magnetic field. In the most preferred embodiments of the present invention, free ferromagnetic layer 228 is also formed of an alloy of cobalt (Co), iron (Fe) and boron (B) comprising, by approximate atomic %, Co (71.2%), Fe (8.8%) and B (20%). This is basically a CoFe alloy with B added to it and can be represented as $(Co_{89}Fe_{11})_{80}B_{20}$. For ferromagnetic layer 228, the percentage of iron can be in the range of approximately 10.5%–13.5% and the percentage of boron can be in the range of approximately 15%–25%.

More specifically, a SAF free layer with a transition metal such as ruthenium (Ru) or rhodium (Rh) sandwiched between two CoFeB layers may also provide strong antiferromagnetic coupling between the two magnetic layers. Additionally, multi-layer stacks that include additional layer pairs of CoFeB and Ru or Rh are useful in various free layers.

In addition to the CoFeB alloys discussed above, other stable amorphous alloys can be used with good success in pinned and fixed ferromagnetic layers 225 and 226 of FIG. 2. Specifically, since the magnetic moments of ferromagnetic layers 225 and 226 are not rotated or switched during normal operation, the device can tolerate significant magnetostriction in these layers. Accordingly, the Fe content in ferromagnetic layers 225 and 226 can be increased to increase the polarization. Examples of other stable amorphous alloys suitable for use in pinned and fixed ferromagnetic layers 225 and 226 include CoFeTa and CoFeHf.

Ta and Hf both have relatively high recrystallization temperatures (>350° C.). In general, the inventive alloys of the present invention can be represented as $(Co_{100-x}Fe_x)_{100-y}D_y$ which represents a CoFe alloy with a dopant D added to it. In this equation, x represents the approximate atomic % of Fe in the CoFe alloy and y is the approximate atomic % of dopant D in the alloy. In the most preferred embodiments of the present invention, these alloys would have a composition with x in a range of approximately 10.5% and 25% and y in a range of approximately 5% and 15%. In the most preferred embodiments of the present invention, D may be any one of Ta, Hf, TaHf, TaC, HfC or TaHfC.

As can be seen from the data in Table 100 of FIG. 1, the CoFeTa and CoFeHf alloys have a measurably higher $H_K$ than most ferromagnetic materials. When these specific alloys are used for layers 225 and 226 of FIG. 2, the relatively large intrinsic anisotropy enables at least one embodiment of this invention in which AF pinning layer 224 is not included. In this embodiment, layers 225 and 226 have the same general thickness or, more specifically, the same magnetic moment, so that they form a balanced SAF structure. Because the SAF is substantially balanced, it has little or no net moment in a zero field and only a small moment due to a small angle between the magnetic moments when a moderate magnetic field is applied. The relatively small net moment, combined with the relatively large intrinsic anisotropy, make this SAF structure relatively stable, without pinning, in fields that would be applied to switch free layer 228. Thus by using the CoFeTa and CoFeHf alloys of the present invention, a simplified thin film stack without an AF pinning layer 224 can be realized.

It should be understood that a reversed, or flipped, structure is also anticipated by this disclosure. More particularly, it is anticipated that the disclosed magnetic element can be formed to include a top fixed, or pinned layer, and thus described as a top pinned structure.

In yet another preferred embodiment of the present invention, the amorphous alloys disclosed herein may be used to create a magnetoresistive (MR) sensor for a read head on a direct access storage device (DASD), such as a hard disk drive or the like. In this application, multi-layer stack 200 is incorporated in a standard read head and is exposed to a magnetic field emanating from a moving magnetic medium, such as a rotating magnetic disk. To make a sensor, the material is processed so that the easy axis of the free layer is perpendicular to the magnetization of the fixed layer In this environment, the magnetic field surrounding the MR sensor changes to reflect the information that has been previously stored on the magnetic disk. The changes in the magnetic field will cause the magnetic moment of the free layer to tilt away from its easy axis with a magnitude and direction, depending on the nature of the information stored on the disk. By monitoring the change in resistance associated with the moment of the free layer magnetic moment, the information stored on the magnetic disk can be interpreted.

In addition to use in the magnetoresistive devices described above, a stable amorphous alloy with good soft properties, low dispersion of $H_k$, and medium to high magnetization typical of high polarization alloys may also be used for the flux concentrating material (cladding) used on the write lines in MRAM elements. These characteristics would provide improved cladding compared to the NiFe or NiFeCo alloys described in the prior art by enabling a thinner cladding layer with less tendency to form undesirable magnetic domain walls or vortices. The amorphous nature of the material is also advantageous to promote smooth sidewalls and further minimize unwanted anisotropy induced during the deposition process. This application of the CoFe-based alloys of the present invention is further described in conjunction with FIG. 3.

Figure 3:
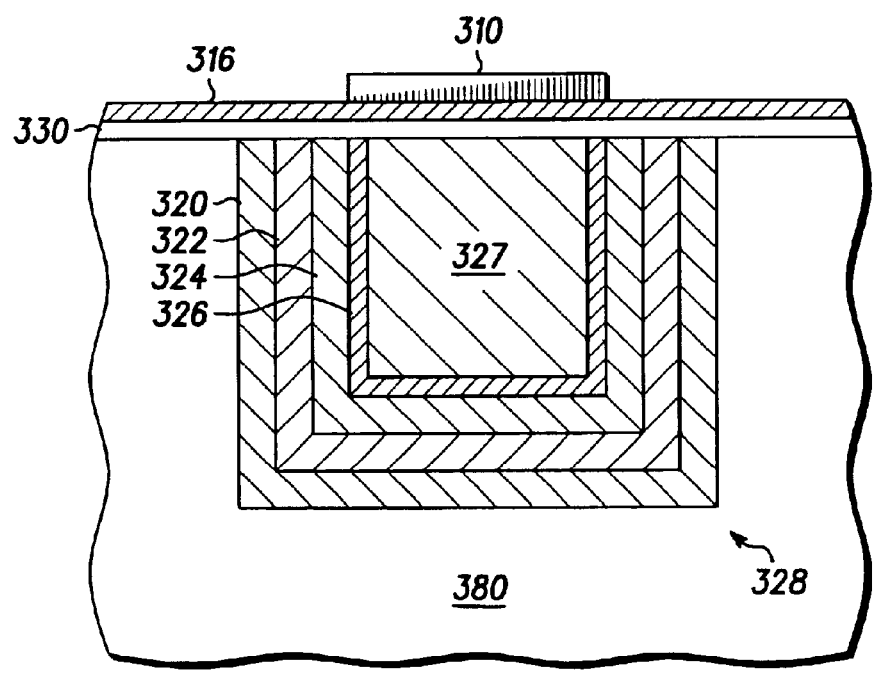
FIG. 3 is a cross-sectional view of a digit line with a cladding layer according to a preferred exemplary embodiment of the present invention.

Referring now to FIG. 3, a cladded copper damascene digit line and bit structure 300 in accordance with a preferred exemplary embodiment of the present invention is shown. Cladded copper damascene digit line 328 incorporates a specific CoFe composition that is formulated to achieve better cladding performance than previously implemented cladding materials. In this specific embodiment, MRAM bit 310 is standard MRAM bit formed according to well-known practices in the art. While a standard MRAM bit is illustrated herein for convenience, it will be understood by those skilled in the art that many other types of semiconductor devices could be provided. Also, while only a single MRAM bit 310 is illustrated, it should be understood that, for example, a complete array of devices or control/driver circuits around the periphery of an array of magnetic memory bits may be formed. Further, FIG. 3 includes a contact metal layer 316 that connects MRAM bit 310 to a transistor (not shown this FIG.) and an insulating layer 330 that isolates the bit line from digit line 328.

During fabrication, the structure is formed by first patterning and etching a trench in a dielectric layer 380, followed by the deposition of a first barrier layer 320, a flux concentrating layer 322, a second barrier layer 324, a copper (Cu) seed layer 326, and finally a plated copper (Cu) layer 327, together forming a copper damascene line 328. In the most preferred embodiments of the present invention, flux-concentrating layer 322 is formed of an amorphous magnetic material. Flux-concentrating layer 322 has the characteristic of concentrating magnetic flux produced by the current flowing in the conductor, therefore, reducing the amount of current required to produce the desired action.

In the most preferred embodiments of the present invention, flux-concentrating layer 322 is an amorphous CoFe-X alloy having high permeability, sufficient to concentrate the magnetic flux in the desired area and be metallurgically compatible with the remaining material structure. In the most preferred embodiments of the present invention, flux-concentrating layer 322 is an alloy of cobalt (Co), iron (Fe) and boron (B) comprising, by approximate atomic %, Co (71.2%), Fe (8.8%) and B (20%). This represents a CoFe alloy with B added to it and can be represented as $(Co_{89}Fe_{11})_{80}B_{20}$. The percentage of iron can be in a range of approximately 9.5% and 13.5% and the percentage of boron can be in a range of approximately 10%–30% and most preferably in the range of approximately 15%–25%.

Flux-concentrating layer 322 is most preferably a nickel-free (Ni-free) alloy. This is significant because the use of Ni in conventional cladding applications typically requires the inclusion of a diffusion barrier layer 324 in an attempt to prevent the Ni contained in the cladding layer from diffusing into the Cu damascene bit line. Additionally, Ni is known to be quite reactive and thermally unstable, both considered undesirable properties for the present application. Finally, the smoother layers provided by the alloys of the present invention provides significantly better magnetic behavior when deposited for cladding. It should be noted that a flipped structure, where the flux is focused downward, is also contemplated by the cladding application disclosed herein.

From the foregoing description, it should be appreciated that the various applications of certain CoFeX alloys, including CoFeB alloys, in magnetoelectronics elements provided herein present significant benefits that would be apparent to one skilled in the art. Furthermore, while multiple embodiments have been presented in the foregoing descriptions, it should be appreciated that a vast number of variations in the embodiments exist. Lastly, it should be appreciated that these embodiments are preferred exemplary embodiments only, and are not intended to limit the scope, applicability, or configuration of the invention in any way. Rather, the foregoing detailed descriptions provide those skilled in the art with a convenient road map for implementing the preferred exemplary embodiments of the invention. It being understood that various changes may be made in the function and arrangement of elements described in the exemplary preferred embodiments without departing from the spirit and scope of the invention as set forth in the appended claims.

What is claimed is:

1. A magnetic tunnel junction comprising:

a first ferromagnetic layer;

a spacer layer formed over said first ferromagnetic layer;

a second ferromagnetic layer formed over said spacer layer;

wherein at least one of said first ferromagnetic layer and said second ferromagnetic layer is an amorphous $(Co_{100-X} Fe_X)_{100-Y}D_Y$ alloy comprising X in a range of approximately 10.5%–25% by atomic %; and wherein D comprises at least one of boron (B), tantalum (Ta), hafnium (Hf), boron-carbon(B—C), tantalum-carbon (Ta—C) and hafnium-carbon (Hf—C).

2. The magnetic tunnel junction of claim 1 wherein D comprises boron and Y is in a range of approximately 15%–25% by atomic %.

3. The magnetic tunnel junction of claim 1 wherein Y is in a range of approximately 5%–15% by atomic % and D comprises at least one of Ta, Hf, TaC, HfC, TaHf, and TaHfC.

4. The magnetic tunnel junction of claim 1 wherein;

said first ferromagnetic layer comprises a free layer, said free layer possessing a free magnetic moment that is free to rotate in the presence of an applied magnetic field;

said second ferromagnetic layer comprises a fixed layer, said fixed layer possessing a fixed magnetic moment, said fixed magnetic moment being fixed in the presence of an applied magnetic field; and wherein said free layer comprises an amorphous $(Co_{100-X} Fe_X)_{100-Y}B_Y$ alloy, said amorphous alloy comprising X in a range of approximately 10.5%–13.5% by atomic % and comprising Y in a range of approximately 15%–25% by atomic %.

5. The magnetic tunnel junction of claim 1 wherein both of said first ferromagnetic layer and said second ferromagnetic layer are an amorphous alloy comprising, by approximate atomic %, Co (71.2%), Fe (8.8%) and B (20%).

6. The magnetic tunnel junction of claim 1 further comprising a coupling layer formed beneath said first ferromagnetic layer.

7. The magnetic tunnel junction of claim 6 wherein said coupling layer comprises one of ruthenium and rhodium.

8. The magnetic tunnel junction of claim 1 further comprising a pinning layer beneath said first ferromagnetic layer, wherein said pinning layer is an alloy comprising at least one of iridium manganese (IrMn), iron manganese (FeMn), rhodium manganese (RhMn), platinum manganese (PtMn), and platinum palladium manganese (PtPdMn).

9. The magnetic tunnel junction of claim 1 wherein said spacer layer comprises an aluminum oxide layer.

10. The magnetic tunnel junction of claim 1 wherein said second ferromagnetic layer is a free layer and comprises an $(Co_{89}Fe_{11})_{80}B_{20}$ alloy.

11. The magnetic tunnel junction of claim 1 further comprising:
   a substrate;
   a base metal layer formed on said substrate;
   a pinning layer formed over said base metal layer;
   a pinned ferromagnetic layer formed on said pinning layer;
   a coupling layer formed on said pinned layer, said first ferromagnetic layer being formed on said coupling layer; and
   wherein each of said first ferromagnetic layer and said second ferromagnetic layer comprises an amorphous $(Co_{100-X} Fe_X)_{100-Y}B_Y$ alloy, said amorphous alloy comprising X in a range of approximately 10.5%–13.5% by atomic % and comprising Y in a range of approximately 15%–25% by atomic %.

12. The magnetic tunnel junction of claim 11 wherein said coupling layer comprises a ruthenium (Ru) layer.

13. The magnetic tunnel junction of claim 11 wherein said spacer layer comprises an aluminum oxide (AlOx) layer.

14. The magnetic tunnel junction of claim 11 further comprising:
   a second coupling layer formed on said second ferromagnetic layer;
   a third ferromagnetic layer formed on said second coupling layer; and
   wherein said second ferromagnetic layer and said second coupling layer and said third ferromagnetic layer comprise a synthetic antiferromagnetic free layer.

15. A magnetoresistive sensor comprising:
   a first ferromagnetic layer, said first ferromagnetic layer comprising a fixed magnetic moment;
   a spacer layer formed on said first ferromagnetic layer;
   a second ferromagnetic layer formed on said spacer layer, said second ferromagnetic layer comprising a free magnetic moment with an easy axis approximately perpendicular to said fixed magnetic moment of said first ferromagnetic layer;
   wherein at least one of said first ferromagnetic layer and said second ferromagnetic layer is an amorphous $(Co_{100-X} Fe_X)_{100-Y}D_Y$ alloy comprising X is in a range of approximately 10.5%–25% by atomic %; and
   wherein D comprises at least one of boron (B), tantalum (Ta), hafnium (Hf), boron-carbon (B—C). tantalum-carbon (Ta—C) and hafnium-carbon (Hf—C).

* * * * *